United States Patent
Tseng

(10) Patent No.: US 6,225,177 B1
(45) Date of Patent: May 1, 2001

(54) ELECTRODE RESISTANCE IMPROVED MOSFET WITH SOURCE AND DRAIN REGIONS REDUCED IN SIZE BEYOND LITHOGRAPHY LIMIT AND METHOD FOR MAKING THE SAME

(75) Inventor: Horng-Huei Tseng, Hsinchu (TW)

(73) Assignee: Vanguard Int'l Semiconductor Corp., Hsinchu (TW)

( * ) Notice: Subject to any disclaimer, the term of this patent is extended or adjusted under 35 U.S.C. 154(b) by 0 days.

(21) Appl. No.: 09/664,112

(22) Filed: Sep. 18, 2000

(51) Int. Cl.$^7$ ............................................. H01L 21/8236
(52) U.S. Cl. ................................................... 438/305
(58) Field of Search ................................. 438/305, 301, 438/303

(56) References Cited

U.S. PATENT DOCUMENTS

| | | | |
|---|---|---|---|
| 4,616,401 | * 10/1986 | Takeuchi . | |
| 5,168,072 | * 12/1992 | Moslehi . | |
| 5,322,809 | * 6/1994 | Moslehi . | |
| 5,474,947 | * 12/1995 | Chang et al. . | |
| 5,902,125 | * 5/1999 | Wu | 438/300 |
| 5,920,783 | * 7/1999 | Tseng et al. | 438/305 |
| 5,930,617 | * 7/1999 | Wu | 438/233 |
| 5,956,584 | * 9/1999 | Wu | 438/232 |
| 5,981,365 | * 11/1999 | Check et al. | 438/592 |
| 6,046,090 | * 4/2000 | Wu | 438/303 |
| 6,096,642 | * 8/2000 | Wu | 438/655 |
| 6,121,100 | * 9/2000 | Andideh et al. | 438/305 |

* cited by examiner

Primary Examiner—Richard Booth
(74) Attorney, Agent, or Firm—Thomas, Kayden, Horstemeyer & Risley

(57) ABSTRACT

A MOSFET whose source and drain regions are reduced in size beyond lithography limit is improved with a reduction of electrode contact resistance by forming a silicide on the gate electrode layer and the source and drain regions thereof. In a method for making the MOSFET, a sacrificial layer is formed in stack on a gate electrode layer of a silicon rich material before source and drain regions are implanted or diffused with the sacrificial layer and gate electrode layer as a mask, an insulator spacer is then formed on sidewalls of the gate electrode layer and the sacrificial layer so that a trench is formed on the gate electrode layer and surrounded by the spacer in the subsequent process when the sacrificial layer is removed, a metal is deposited in the trench and on the source and drain regions with a portion extending to an isolation region which surrounds the MOSFET and practiced with a heat treatment to form a silicide on the gate electrode layer and the source and drain regions, and finally a dielectric layer is deposited on the metal in which contact holes are then formed and a conductive material is filled into the contact holes to reach the metal.

32 Claims, 6 Drawing Sheets

ELECTRODE RESISTANCE IMPROVED MOSFET WITH SOURCE AND DRAIN REGIONS REDUCED IN SIZE BEYOND LITHOGRAPHY LIMIT AND METHOD FOR MAKING THE SAME

FIELD OF THE INVENTION

The present invention relates generally to a semiconductor device and method for making the semiconductor device, and more particularly, to an improvement of electrode resistance for a MOSFET with source and drain regions reduced in size beyond lithography limit and method for making the MOSFET.

BACKGROUND OF THE INVENTION

As described in U.S. Pat No. 4,713,356 issued to Hiruta, in conventional MOSFET devices, a lot of drawbacks are present in micropatterning for high integration in integrated circuits. For instance, as the junction between source and drain regions is made shallower in order to further reduce the device size, the surface resistance of source and drain regions and the junction resistance of gate electrode increase. As a result, a significantly longer delay time for applications with the device appears. Additionally, as channel length decreases, short channel effects can occur, thereby reducing the threshold voltage of the transistor and making stable transistor characteristics difficult to be obtained. It is therefore proposed to deposit tungsten over the source and drain regions and the gate electrode in order to resolve these problems. However, a small residue of tungsten on the spacer on the sidewalls of the gate electrode and the isolation region of the device reduces the insulation properties between the gate electrode and the source and drain regions. A problem is thus created for both circuit reliability and high integration. If the tungsten attached to the spacer of the gate electrode and the isolation region of the device is etched to improve insulation properties, damages may result to the tungsten layer itself and also to the underlying substrate since the tungsten layer is only about 1,000 A, thus good contact is difficult to be obtained. Moreover, even if a device size is further reduced, the portion of the device size occupied by source and drain regions still remains large, since the size of a device region in a MOSFET is determined by the gate area and the size of source and drain regions. In addition, contact holes are conventionally formed to be separated from gate electrode in order to preserve the insulation properties between the wiring layers for the gate electrode and the source and drain regions, which results in an increase of area of the source and drain regions.

Hiruta disclosed in U.S. Pat No. 4,713,356 a method of manufacturing a MOS transistor in which the portion of the area occupied by the source and drain regions are reduced. In this prior art method, the sidewalls of a gate electrode are first selectively deposited with an insulation film, then conductive material layers are selectively formed on the source and drain regions, partially extending to the side portions of the isolation region for the device, and contact holes filled with a conductive material in an insulation protective film are formed to reach the conductive material layers for forming source and drain wiring layers after the insulation protective film is formed over the entire surface of the conductive material layers and the gate electrode. However, the contact resistance to the gate electrode and the source and drain regions are desired to be further reduced when the MOSFET is made smaller. In particular, the device provided by Hiruta cannot be formed with a metal layer on the gate electrode as in the above described prior art, resulted in that the contact resistance to the gate electrode cannot be further reduced in the device.

On the other hand, silicide to be formed on an electrode in order to reduce the electrode resistance is well known, it is therefore desired for the small device to employ a silicide on the electrode of the device to further reduce the electrode resistance thereof. However, a gate electrode with a silicide thereon cannot be obtained in the transistor provided by Hiruta, since metal gate cannot be formed in this device. It is therefore desired an improvement of electrode resistance for a MOSFET with source and drain regions reduced in size beyond lithography limit and method for making the MOSFET.

SUMMARY OF THE INVENTION

It is therefore an object of the present invention to provide a MOSFET and method for making the MOSFET with the proportion of the area occupied by the source and drain regions reduced without adversely affecting the characteristics of the semiconductor device, and high integration and high speed operation are available.

Another object of the present invention is to further reduce the electrode resistance for a MOSFET with source and drain regions reduced in size beyond lithography limit and method for making the MOSFET.

According to the present invention, a MOSFET is made with an insulator spacer surrounding the gate electrode layer of silicon rich material on which a trench metal layer is formed and surrounded by the spacer. Metal layers are also deposited on the source and drain regions in the formation of the trench metal. A heat treatment is then applied to form silicide layers for the electrode resistance reduction on the gate electrode layer and source and drain regions in use of the metal layers. In addition, conductive layers or the metal layers on the source and drain regions are formed extending from the silicide on the source and drain regions to a surface of adjacent isolation region on which wiring layers are formed through contact holes to reach the conductive layers or the metal layers.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which:

FIG. 7 is a sectional view showing when another conductive layer 38 is deposited on the entire surface to contact with the metal layers 36 and extends partially over isolation region 12 in a process following to FIG. 6a;

DETAILED DESCRIPTION

Figure 1:
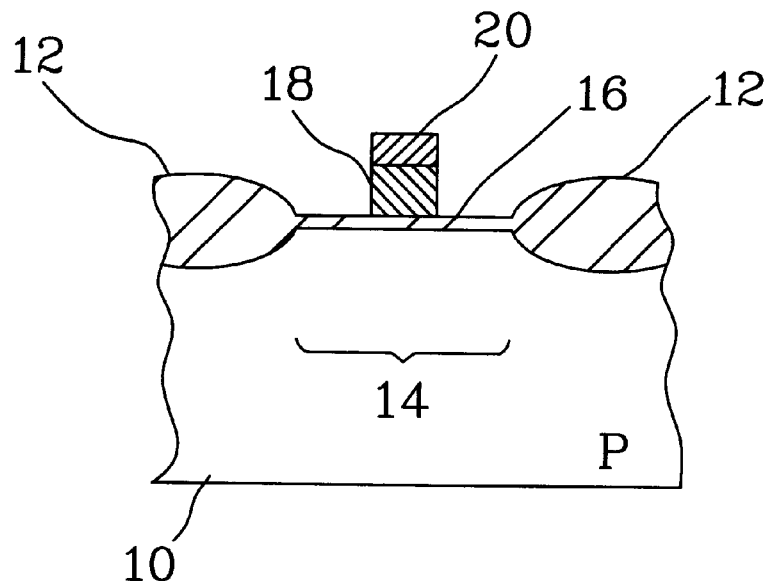
FIG. 1 is a sectional view for illustration of one embodiment according to the present invention when a sacrificial layer 20 and a gate electrode layer 18 are selectively formed in stack on a gate oxide 16 in manufacture of a MOSFET.

As shown in FIG. 1 for one embodiment of the present invention, a p-type silicon substrate 10 is formed with an isolation region 12 such as a LOCOS field oxide thereon to surround an active region 14 where is to be formed with a MOSFET. A gate oxide 16 in a thickness of about from 50 to 300 A is formed on the active region 14. After a polycrystalline silicon film is deposited over the entire surface in a thickness of about 1,500 to 3,000 A and a sacrificial layer such as a silicon nitride or silicon dioxide is deposited on the polycrystalline silicon film in a thickness of about 500 to 1,500 A, the sacrificial layer is selectively etched by lithography process with photo resist to form a sacrificial layer 20 and then the polycrystalline silicon film is selectively etched with the sacrificial layer 20 as a mask to form a gate electrode layer 18 of polycrystalline silicon in a self-aligned manner. As a result, the gate electrode layer 18 and the sacrificial layer 20 are formed in stack on the gate oxide 16 as shown in FIG. 1.

Figure 2A:
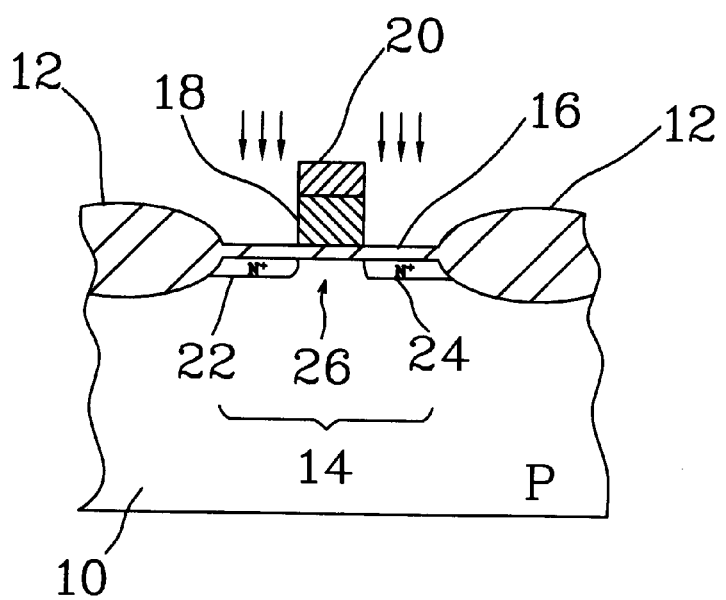
FIG. 2a and 2b are sectional views respectively showing two embodiments according to the present invention to form source and drain regions 22 and 24 in the manufacture of a MOSFET.

An n-type impurity is then ion-implanted into the p-type substrate 10 with the stacked gate electrode layer 18 and sacrificial layer 20 as a mask to form n+-type source and drain regions 22 and 24 in the active region 14 of, as shown in FIG. 2a. Therefore, a channel region 26 of the MOSFET to be formed is obtained under the gate electrode layer 18 between the source and drain regions 22 and 24. In another embodiment as shown in FIG. 2b, after the gate electrode layer 18 and sacrificial layer 20 are formed, the gate oxide 16 is selectively removed and then diffused n+-type source and drain regions 22 and 24 are formed with the stacked gate electrode layer 18 and sacrificial layer 20 as the mask.

Figure 2B:
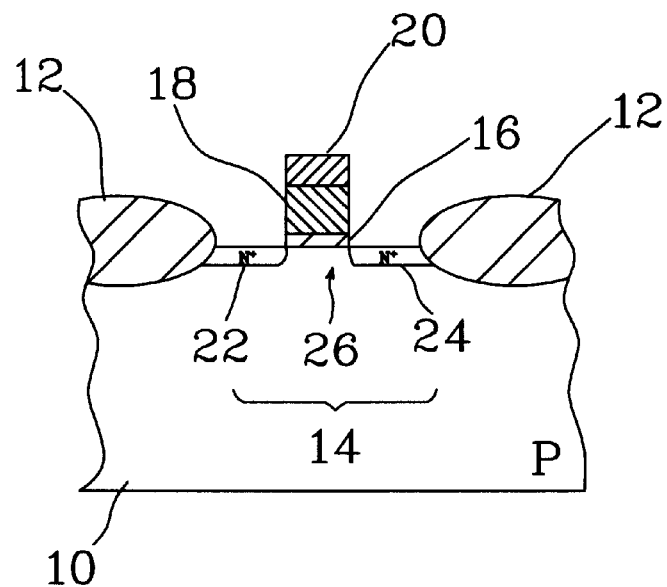
Figure 3:
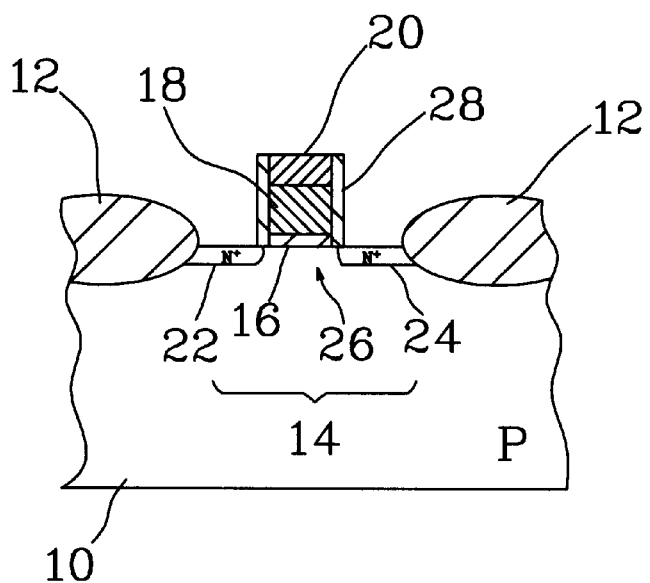
FIG. 3 is a sectional view in the manufacture of a MOSFET in which an insulator spacer 28 is formed in one embodiment according to the present invention.

After selectively removing the gate oxide 16 with the stacked gate electrode layer 18 and sacrificial layer 20 as a mask in FIG. 2a or in follow-up to FIG. 2b, an insulator spacer 28 is formed on the sidewalls of the gate electrode layer 18 and sacrificial layer 20, as shown in FIG. 3. When a silicon nitride is used to form the sacrificial layer 20, a silicon dioxide is formed over the entire surface by CVD method and then sputter-etched with an inert gas to remove the portions of the silicon dioxide film on the sacrificial layer 20 and source and drain regions 22 and 24 such that only the spacer 28 on the sidewalls of the gate electrode layer 18 and sacrificial layer 20 is left In other embodiment, a thermal oxidation process may be applied to form an oxide spacer 28 on the sidewalls of the gate electrode layer 18 and sacrificial layer 20. Alternately, if the sacrificial layer 20 is formed of oxide, the insulator spacer 28 may be a silicon nitride.

Figure 4:
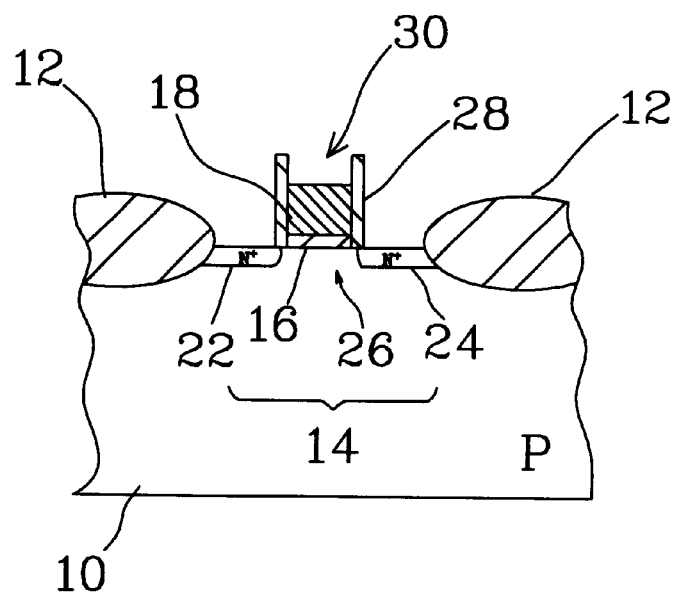
FIG. 4 is a sectional view showing after the sacrificial layer 20 is removed to leave a trench 30 on the gate electrode layer 18 and surrounded by the spacer 28 according to the present invention.

Now the sacrificial layer 20 is removed to leave a trench 30 on the gate electrode layer 18 and surrounded by the spacer 28, as shown in FIG. 4. A wet etching process with a hot phosphoric acid can easily attain the purpose when the sacrificial layer 20 is a silicon nitride. In other embodiment, a hydrofluoric acid etching is a suitable process if the sacrificial layer 20 is composed of silicon dioxide.

Figure 5:
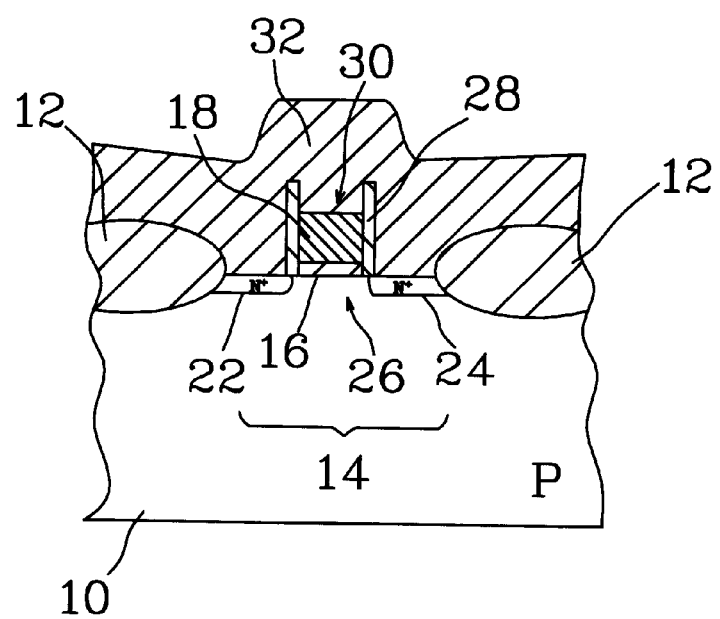
FIG. 5 is a sectional view showing a metal layer 32 deposited on the entire surface to fill in the trench 30 and cover on the source and drain regions 22 and 24 according to the present invention.
Figure 6A:
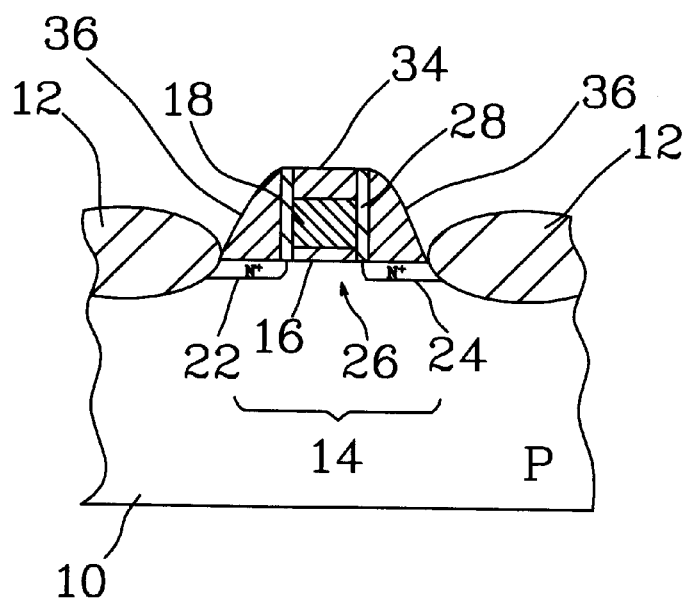
FIG. 6a and 6b are sectional views respectively showing two embodiments after the metal 32 is etched back to form metal layers 34 and 36 and 37 according to the present invention.
Figure 6B:
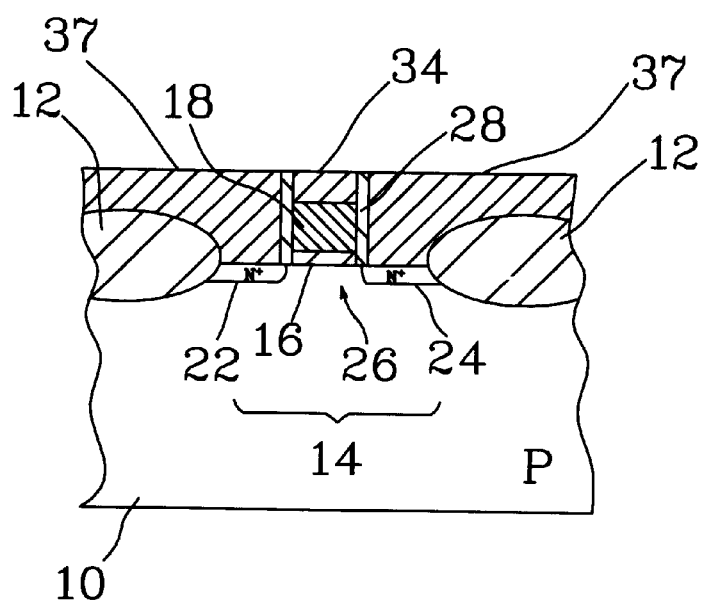
Figure 7:
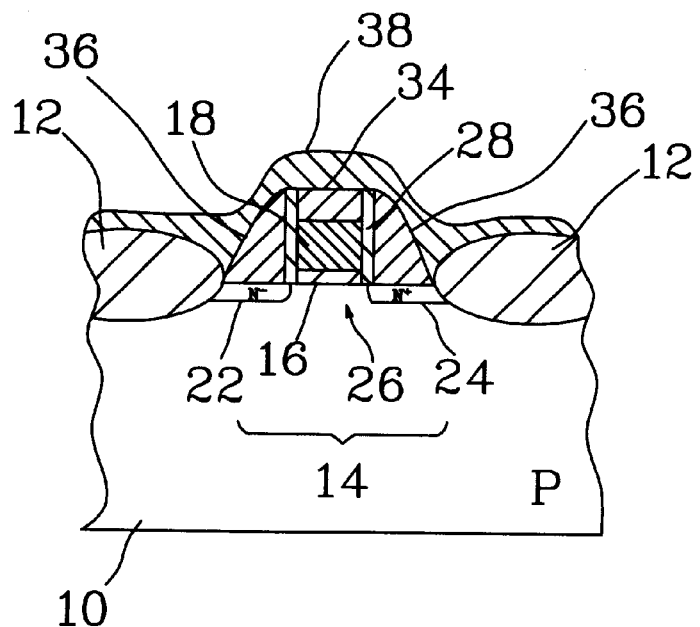

As shown in FIG. 5, a metal 32 such as tungsten is then deposited over the entire surface by a CVD method in order to fill in the trench 30 and cover on the source and drain regions 22 and 24 with the metal 32 and an etching back process as shown in FIG. 6a or 6b is followed. In FIG. 6a, the tungsten layer 32 is removed by sputter etching except for its portions in the trench 30 and on the sidewalls of the spacer 28 such that a tungsten layer 34 in the trench 30 and tungsten layers 36 in contact with the source and drain regions 22 and 24 are formed. Another conductive layer 38 such as CVD tungsten and polycrystalline silicon is subsequently deposited on the entire surface, as shown in FIG. 7. While a CMP process is applied to the metal layer 32 until it is etched to the top surface of the spacer 28 so as to form a metal 34 in the trench 30 and metal layers 37 covered on the source and drain regions 22 and 24 preferably with a planarized top surface, as shown in FIG. 6b. After that, a heat treatment such as thermal process or annealing is applied to form a silicide on the gate electrode layer 18 and source and drain regions 22 and 24 with use of the metal 34 and 36/37 respectively in contact with the gate electrode layer 18 and source and drain regions 22 and 24. The silicide therefore formed reduces the electrode resistance to the gate electrode layer 18 and source and drain regions 22 and 24, which is especially advantageous when the MOSFET is made in small size.

Figure 8A:
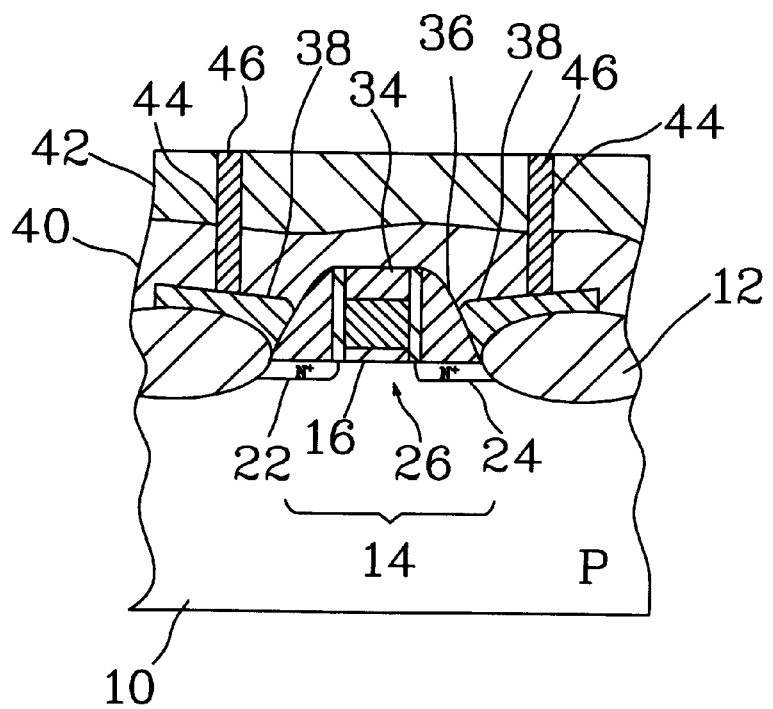
FIG. 8a is a sectional view showing when contacts 46 are prepared in dielectric layers 40 and 42 following to FIG. 7.
Figure 8B:
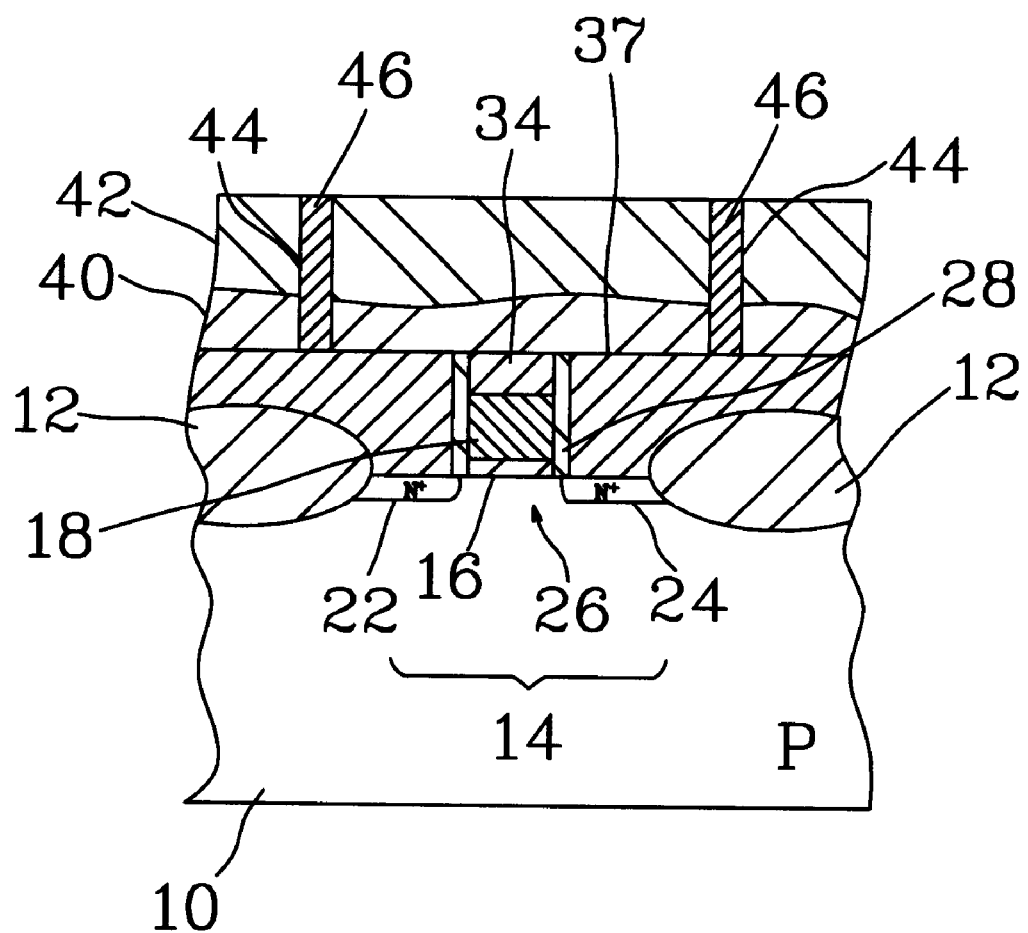
FIG. 8b is a sectional view showing when contacts 46 are prepared in dielectric layers 40 and 42 following to FIG. 6b.

Following to FIG. 7, the conductive layer 38 is etched back by a CMP process or directional etching after a photo resist coating to partially remove its portion on the metal 34 and spacer 28 only portions 38 of conductive layer are thus left with one side of each portion 38 respectively in contact with each of the metal layers 36 and the other side of each thereof respectively extending over the adjacent isolation region 12, as shown in FIG. 8a. Finally, a thick dielectric layer composed of a CVD silicon dioxide 40 and a BPSG 42 is formed over the entire surface, and contact holes 44 are formed in the silicon dioxide 40 and BPSG 42 followed with a conductive material 46 such as aluminum filling each therein to respectively reach the conductive layers 38 for wiring to the source and drain regions 22 and 24 to prepare a MOSFET. Alternately following to FIG. 6b, a thick dielectric layer composed of a CVD silicon dioxide 40 and a BPSG 42 is formed directly over the planarized top surface of the metal layers 34 and 37 and spacer 28, and contact holes 44 are formed in the silicon dioxide 40 and BPSG 42 followed with a conductive material 46 such as aluminum filling each therein in the same manner as in FIG. 8a to respectively reach the conductive layers 38 for wiring to the source and drain regions 22 and 24 of the MOSFET prepared.

In the MOSFET structure and method according to the present invention, the area of source and drain regions 22 and 24 can be considerably reduced beyond lithography limit and thus the active region 14 and the junction capacitance of the source and drain regions 22 and 24 are reduced, therefore high speed operation and high integration are allowed. In addition to the reduction of contact resistance and sectional area of wiring layers 46 for they are in contact with conductive layers 38 or metal layers 37 through the contact holes 44, the electrode resistance is further reduced by the silicide layers on the gate electrode layer 18 and source and drain regions 22 and 24. Moreover, the surfaces of the source and drain regions 22 and 24 are protected from damages in the subsequent process since the metal layers 36 and 37 on the source and drain regions 22 and 24 are thick.

While the present invention has been described in conjunction with preferred embodiments thereof, it is evident that many alternatives, modifications and variations will be apparent to those skilled in the art Accordingly, it is intended to embrace all such alternatives, modifications and variations that fall within the spirit and scope thereof as set forth in the appended claims.

What is claimed is:

1. A method for making a MOSFET in an active region surrounded by an isolation region in a surface of a silicon substrate, said method comprising the steps of:

forming a gate oxide on said active region;

selectively forming a gate electrode layer of a silicon rich material and a sacrificial layer in stack on said gate oxide;

forming source and drain regions in said active region with said gate electrode and sacrificial layers as a mask;

selectively removing a portion of said gate oxide on said source and drain regions;

forming an insulator spacer on sidewalls of said gate electrode and sacrificial layers;

removing said sacrificial layer in result with a trench formed on said gate electrode layer and surrounded by said spacer;

depositing a metal layer in said trench and on said source and drain regions partially extending to a surface of said isolation region;

forming a suicide on said gate electrode layer and source and drain regions with use of said conductive and gate electrode layers;

depositing a conductive layer on said metal layer on said source and drain regions partially extending to a surface of said isolation region;

forming a dielectric layer on said conductive layer;

forming contact holes in said dielectric layer extending to said conductive layer; and filling a conductive material in said contact holes reaching said conductive layer.

2. A method according to claim 1, wherein said gate electrode layer is formed of polycrystalline silicon.

3. A method according to claim 1, wherein said sacrificial layer is formed of silicon nitride.

4. A method according to claim 1, wherein said spacer is formed of thermal or CVD silicon dioxide.

5. A method according to claim 1, wherein said metal layer is formed of CVD tungsten.

6. A method according to claim 1, wherein said silicide is formed by heat treatment.

7. A method according to claim 1, wherein said sacrificial layer is removed by a high selectivity etch.

8. A method for making a MOSFET in an active region surrounded by an isolation region in a surface of a silicon substrate, said method comprising the steps of:

forming a gate oxide on said active region;

selectively forming a gate electrode layer of a silicon rich material and a sacrificial layer in stack on said gate oxide;

forming source and drain regions in said active region with said gate electrode and sacrificial layers as a mask;

selectively removing a portion of said gate oxide on said source and drain regions;

forming an insulator spacer on sidewalls of said gate electrode and sacrificial layers;

removing said sacrificial layer in result with a trench formed on said gate electrode layer and surrounded by said spacer;

depositing a metal layer in said trench and on said source and drain regions;

forming a silicide on said gate electrode layer and source and drain regions with use of said metal and gate electrode layers;

depositing a conductive layer on said metal layer on said source and drain regions partially extending to a surface of said isolation region;

forming a dielectric layer on said conductive layer;

forming contact holes in said conductive layer extending to a surface of said conductive layer; and filling a conductive material in said contact holes reaching said conductive layer.

9. A method according to claim 8, wherein said gate electrode layer is formed of polycrystalline silicon.

10. A method according to claim 8, wherein said sacrificial layer is formed of silicon nitride.

11. A method according to claim 8, wherein said spacer is formed of thermal or CVD silicon dioxide.

12. A method according to claim 8, wherein said metal layer is formed of CVD tungsten.

13. A method according to claim 8, wherein said silicide is formed by heat treatment.

14. A method according to claim 8, wherein said sacrificial layer is removed by a high selectivity etch.

15. A method according to claim 8, further comprising etching back said metal layer for removing said metal layer on said spacer and leaving a portion of said metal layer in said trench and on said source and drain regions after depositing said metal layer.

16. A method according to claim 8, further comprising etching back said conductive layer for removing said conductive layer on said spacer and metal layer in the trench and leaving a portion of said conductive layer partially extending to said surface of said isolation region after depositing said conductive layer.

17. A method for making a MOSFET in an active region surrounded by an isolation region in a surface of a silicon substrate, said method comprising the steps of:

forming a gate oxide on said active region;

selectively forming a gate electrode layer of a silicon rich material and a sacrificial layer in stack on said gate oxide;

selectively removing a portion of said gate oxide on said source and drain regions;

forming source and drain regions in said active region with said gate electrode and sacrificial layers as a mask;

forming an insulator spacer on sidewalls of said gate electrode and sacrificial layers;

removing said sacrificial layer in result with a trench formed on said gate electrode layer and surrounded by said spacer;

depositing a metal layer in said trench and on said source and drain regions partially extending to a surface of said isolation region;

forming a silicide on said gate electrode layer and source and drain regions with use of said metal and gate electrode layers;

depositing a conductive layer on said metal layer on said source and drain regions partially extending to a surface of said isolation region;

forming a dielectric layer on said conductive layer;

forming contact holes in said dielectric layer extending to said conductive layer; and filling a conductive material in said contact holes reaching said conductive layer.

18. A method according to claim 17, wherein said gate electrode layer is formed of polycrystalline silicon.

19. A method according to claim 17, wherein said sacrificial layer is formed of silicon nitride.

20. A method according to claim 17, wherein said spacer is formed of thermal or CVD silicon dioxide.

21. A method according to claim 17, wherein said metal layer is formed of CVD tungsten.

22. A method according to claim 17, wherein said silicide is formed by heat treatment.

23. A method according to claim 17, wherein said sacrificial layer is removed by a high selectivity etch.

24. A method for making a MOSFET in an active region surrounded by an isolation region in a surface of a silicon substrate, said method comprising the steps of:

forming a gate oxide on said active region;

selectively forming a gate electrode layer of a silicon rich material and a sacrificial layer in stack on said gate oxide;

forming source and drain regions in said active region with said gate electrode and sacrificial layers as a mask;

selectively removing a portion of said gate oxide on said source and drain regions;

forming an insulator spacer on sidewalls of said gate electrode and sacrificial layers;

removing said sacrificial layer in result with a trench formed on said gate electrode layer and surrounded by said spacer;

depositing a metal layer in said trench and on said source and drain regions;

forming a silicide on said gate electrode layer and source and drain regions with use of said metal and gate electrode layers;

depositing a conductive layer on said metal layer on said source and drain regions partially extending to a surface of said isolation region;

forming a dielectric layer on said conductive layer;

forming contact holes in said conductive layer extending to a surface of said conductive layer; and filling a conductive material in said contact holes reaching said conductive layer.

25. A method according to claim 24, wherein said gate electrode layer is formed of polycrystalline silicon.

26. A method according to claim 24, wherein said sacrificial layer is formed of silicon nitride.

27. A method according to claim 24, wherein said spacer is formed of thermal or CVD silicon dioxide.

28. A method according to claim 24, wherein said metal layer is formed of CVD tungsten.

29. A method according to claim 24, wherein said silicide is formed by heat treatment.

30. A method according to claim 24, wherein said sacrificial layer is removed by a high selectivity etch.

31. A method according to claim 24, further comprising etching back said metal layer for removing said metal layer on said spacer and leaving a portion of said metal layer in said trench and on said source and drain regions after depositing said metal layer.

32. A method according to claim 24, further comprising etching back said conductive layer for removing said conductive layer on said spacer and metal layer in the trench and leaving a portion of said conductive layer partially extending to said surface of said isolation region after depositing said conductive layer.

* * * * *